United States Patent [19]
Doty et al.

[11] Patent Number: 5,202,633
[45] Date of Patent: Apr. 13, 1993

[54] HIGH TEMPERATURE NMR SAMPLE SPINNER

[75] Inventors: F. David Doty, Columbia; Jonathan B. Spitzmesser, Blythewood, both of S.C.; David G. Wilson, Winchester, Mass.

[73] Assignee: Doty Scientific, Inc., Columbia, S.C.

[21] Appl. No.: 607,521

[22] Filed: Nov. 1, 1990

[51] Int. Cl.[5] .......................................... G01R 33/20
[52] U.S. Cl. .................................................. 324/321
[58] Field of Search ................ 324/300, 307, 321, 318

[56] References Cited

U.S. PATENT DOCUMENTS

| | | |
|---|---|---|
| 3,681,683 | 9/1970 | Huber . |
| 4,088,944 | 10/1976 | Engler et al. . |
| 4,209,293 | 6/1980 | Sugai et al. . |
| 4,254,373 | 3/1981 | Lippmaa et al. . |
| 4,275,350 | 6/1981 | Hill et al. . |
| 4,456,882 | 6/1984 | Doty . |
| 4,470,813 | 9/1984 | Thorburn . |
| 4,511,841 | 4/1985 | Bartuska et al. . |
| 4,641,098 | 2/1987 | Doty . |
| 4,676,305 | 6/1987 | Doty . |
| 4,710,719 | 12/1987 | Doty . |
| 4,739,270 | 4/1988 | Daugaard et al. . |
| 4,786,251 | 11/1988 | Ruegsegger . |
| 4,806,868 | 11/1988 | Schulke .............................. 324/321 |
| 4,842,516 | 6/1988 | Choisser . |
| 4,859,949 | 1/1988 | McKenna . |
| 4,899,111 | 2/1990 | Pines et al. . |
| 4,940,942 | 7/1990 | Bartuska ............................. 324/321 |

FOREIGN PATENT DOCUMENTS

| | | |
|---|---|---|
| 073667 | 3/1983 | European Pat. Off. . |
| 2628214 | 9/1989 | France . |
| 1271262 | 4/1972 | United Kingdom . |

OTHER PUBLICATIONS

"A Refrigeration System Incorporating A Low-Capacity, High-Speed, Gas-Bearing-Supported Expansion Turbine" by Mann et al.
"A Cold-Moderation Refrigerator Incorporating A High-Speed Turbine Expander" by Voth et al.
"Small Turbo-Brayton Cryocoolers" by Sixsmith et al.
"The Operations Manual for High Temperature Probe with Temperature Controller".

Primary Examiner—Michael J. Tokar
Attorney, Agent, or Firm—Brumbaugh, Graves, Donohue & Raymond

[57] ABSTRACT

A high-strength, thin-wall ceramic cylinder partially closed at one end, with radial-inflow turbine blades ground into the partially closed end thereof, provides the rotational drive, surface protection, and burst strength necessary to contain and spin a low strength, disposable soft ceramic capsule, loaded with a sample for NMR experiments, at high rotational speeds inside an NMR receiver/transmitter coil. An improved radial inflow turbine design results in higher efficiency for micro-turbines. A cylindrical air journal bearing at both ends provides radial stability and support. An axial thrust air bearing is formed at the end opposite the turbine blades between the sacrificial bottom of the soft capsule and a thrust ring. The high-strength ceramic is typically of a partially stabilized zirconia or hot pressed silicon nitride. The disposable capsule is typically of hexagonal boron nitride.

10 Claims, 5 Drawing Sheets

HIGH TEMPERATURE NMR SAMPLE SPINNER

FIELD OF THE INVENTION

This invention relates to a spinner assembly for the nuclear magnetic resonance (NMR) measurement of polycrystalline and/or amorphour solids and relates particularly to a spinner assembly for use at very high temperatures using high-speed spinning for line narrowing, especially magic angle spinning (MAS).

BACKGROUND OF THE INVENTION

The NMR spectroscopist often finds it necessary to observe a wide variety of nuclides, especially $^{13}C$, $^{1}H$, $^{31}P$, $^{18}F$, $^{17}Al$, $^{29}Si$, $^{23}Na$, $^{17}O$, and $^{15}N$ in the study of commercially and scientifically important chemicals. It is often necessary, and always desirable, for the NMR sample spinner and the rest of the probe electronics to be devoid of the elements of interest to avoid interfering background signals. This generally necessitates the use of a wide variety of sample spinners of different materials. The materials selection is further severely limited by the requirement of very high strength, very high modulus, low dielectric loss, very low magnetic susceptibility, and chemical inertness with respect to the sample and gases present—all simultaneous requirements to be met at the temperature at which the NMR technique is to be applied to the desired sample.

Sample spinners heretofore available have not permitted convenient use at temperatures above 250° C. The primary object of the instant invention is to allow convenient MAS NMR experiments at temperatures at least up to 650° C. and perhaps up to 1200° C. Another object is to obtain higher turbine efficiency for reduced drive gas heating problems and the laboratory hazards associated therewith. A further object is to make versatile sample containers available at an acceptable cost. A further object is to develop improved microturbines and thrust bearings for various applications.

FIG. 1 illustrates the prior art high-temperature MAS all-zirconia spinner assembly. A zirconia rotor 1, typically with outside diameter about 7 mm, has impulse turbine flutes 2 ground onto the outer surface at the drive end 3. A zirconia rotor plug 4 is cemented into the opposite end of the rotor. The sample is loaded into the rotor through a small axial hole 6. Centrifugal forces during spinning prevent the sample from escaping. Removal of the sample after the high temperature NMR experiment is usually very difficult, as some fusing or densification of the sample may have occurred at high temperature.

Air jets from nozzles 11 impinging on these flutes produce the desired spinning. Rotor surface speeds are typically 30% of the speed of sound. For example, a 7 mm spinner may rotate at 4500 Hz. Rear air bearing orifices 12 and front air bearing orifices 13 near opposite ends of the stator 14 provide radial support of the rotor within the zirconia stator 14. Air escaping rearward over the rotor plug 4 produces a radially-inward-flow axial thrust air bearing 16 between the end ring 17 and the rear end of the rotor. A manifold 18 inside the zirconia housing 19 distributes pressurized nitrogen to the bearing orifices 12, 13 and the drive nozzles 11. The receiver/transmitter copper coil 20 is wound around the stator with leads 21, 22 coming out through the housing. Nitrogen turbine exhaust gas 23 escapes through exhaust holes 24 in the housing cap 25 with sufficient backpressure to maintain axial positioning against the thrust air bearing 16.

The low efficiency of the impulse turbine with simple flutes 2 requires high nitrogen gas consumption. This in turn requires high heater power for high temperature operation. The hot exhaust gas 23 must be cooled to a safe temperature before it can be exhausted in the vicinity of the surrounding superconducting magnet required for the NMR experiment. This is typically achieved via a counterflow heat exchanger external to the spinner assembly. Space constraints inside the NMR magnet limit the extent to which this can be readily achieved. Hence, a reduction in gas consumption is highly beneficial.

SUMMARY OF THE INVENTION

A high-strength, thin-wall ceramic cylinder partially closed at one end, with a symmetric fluid impeller means such as radial-inflow turbine blades ground into the partially closed end thereof, provides the rotational drive, surface protection, and burst strength necessary to contain and spin a low strength, disposable soft ceramic capsule, loaded with a sample for NMR experiments, at high rotational speeds inside an NMR receiver/transmitter coil. An improved radial inflow turbine design results in higher efficiency for microturbines. A cylindrical air journal bearing at both ends provides radial stability and support. An axial thrust air bearing is formed at the end opposite the turbine blades between the sacrificial bottom of the soft capsule and a thrust ring. The high-strength ceramic is typically of partially stabilized zirconia or hot pressed silicon nitride. The disposable capsule is typically of hexagonal boron nitride.

In order to achieve the objects of the invention a high precision radial microturbine has been developed. The precision radial inflow microturbine for use at rotational frequencies above 2000 Hz in high magnetic fields comprises a non-metallic support plate for transmitting torque to a cylinder and a plurality of axially extended, curved, airfoil turbine blades, symmetrically arranged on the axial surface of the plate. The non-metallic support plate can be made from the group consisting of partially stabilized zirconia, hot pressed silicon nitride, sapphire, polyetherketone and composites thereof. Each turbine blade has a radial entrance edge at a constant entrance radius from the axis of the ring, and a radial exit edge at a substantially constant radius from the axis of the ring such that the exit radius is less than 90% and greater than 40% of the entrance radius. The entrance radius typically ranges from 1.5 to 15 mm. The blades have a mean flow entrance angle between 30° and 75° with respect to the entrance radius and an exit angle between 25° and 70° with respect to the radius in the negative direction. Each blade has a free axial end which sweeps out the same surface of revolution about the axis of symmetry of the ring as that swept out by the free end of any other blade. The turbine blade has an axial length less than 1 mm at the gas entrance edge. In addition, each blade has side surfaces substantially parallel to the axis of symmetry. Nozzles direct pressurized gas toward the entrance edges of the blades at an angle greater than 50° with respect to the entrance radius and less than 10° with respect to a plane perpendicular to the axis of symmetry. An axial flow shroud is formed which contains a smooth shroud substantially congruent to the surface of revolution for inhibiting axial flow over the blades and defining radial gas flow passages between the blades. The shroud surface is non-concave and has a maximum slope at any point on the shroud surface of 30° with respect to a plane perpendicular to the axis of symmetry so that flow is substantially radial over the blades. The shroud is concentric with the axis and is displaced axially from the surface of revolution a distance of less than 20% of the maximum axial length of the turbine blades.

BRIEF DESCRIPTION OF THE DRAWING

The invention will be disclosed with reference to a drawing, of which.

DETAILED DESCRIPTION OF THE INVENTION

Figure 2:
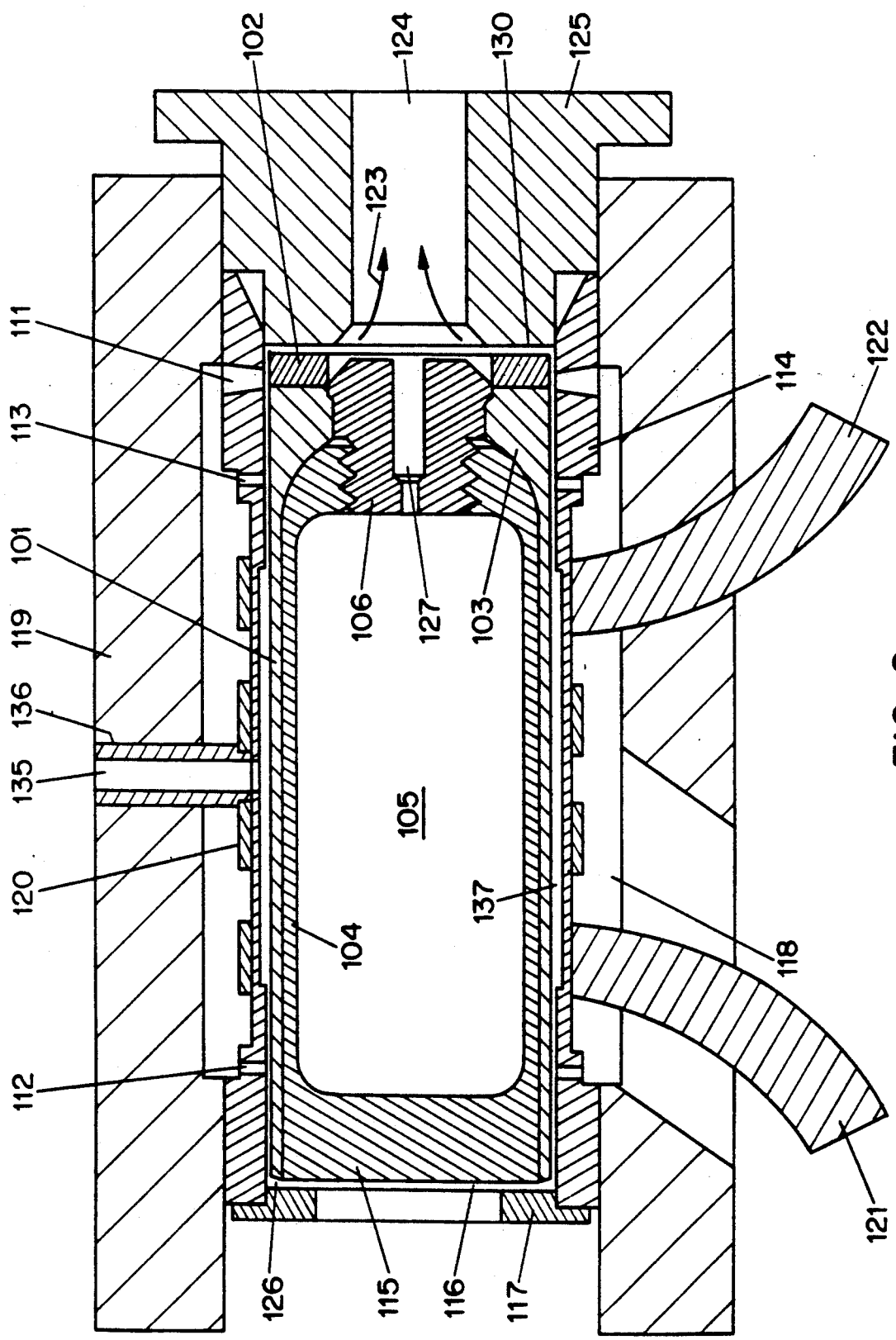
FIG. 2 shows the all-ceramic MAS spinner assembly according to the instant invention.
Figure 3:
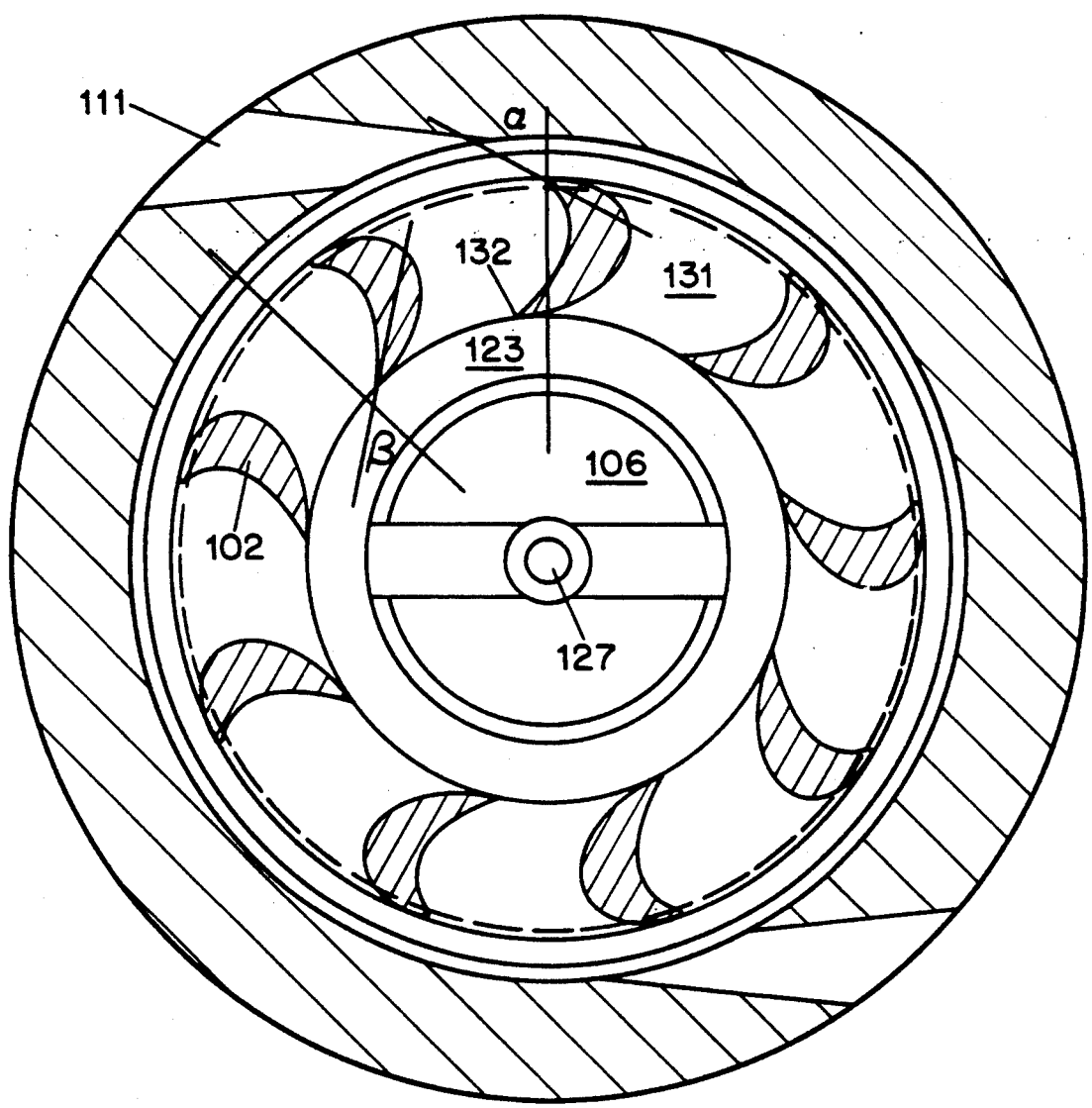
FIG. 3 shows a cross-sectional view of the turbine blade end of the high temperature MAS spinner assembly.

FIGS. 2 and 3 show the all-ceramic MAS spinner assembly according to the instant invention. A zirconia rotor shell 101 has radial inflow turbine blades 102 ground into the partially closed drive end 103. The sample 105 is loaded into a boron nitride (BN) disposable capsule 104. The capsule 104 is held inside the shell 101 by a ceramic screw 106. An outgassing hole 127 is usually required. Removal of the sample following the high temperature NMR experiment is easily accomplished; the BN capsule is disposed of after the NMR experiment.

Air jets from nozzles 111 impinging on the turbine blades produce the desired spinning. Rear air bearing orifices 112 and front air bearing orifices 113 near opposite ends of the stator 114 provide radial support of the rotor within the zirconia stator 114. Air escaping over the capsule bottom 115 produces a radially-inward-flow axial thrust air bearing 116 between the end ring 117 and the capsule bottom 115. A manifold 118 inside the zirconia housing 119 distributes pressurized nitrogen to the bearing orifices 112, 113 and the drive nozzles 111. The receiver/transmitter copper coil 120 is wound around the stator with leads 121, 122 coming out through the housing. Nitrogen turbine exhaust gas 123 escapes through a central exhaust hole 124 in the housing cap 125 with sufficient backpressure to maintain axial positioning against the thrust air bearing 116. An external chamber 126 (or radius) on the rotor shell is beneficial in improving the axial air bearing performance.

Radial clearance between the rotor and stator is typically 0.02–0.04 mm at high temperatures, but less than 5 μm for cryogenic applications. Axial thrust bearing clearance is approximately double the radial clearance.

It is necessary that the bottom end 115 of the capsule 104 extend axially outward at least to or slightly beyond the end of the rotor shell cylinder 101 or a satisfactory thrust air bearing 116 will not be formed. A super-precision fit (less than 1 μm radial clearance between the capsule and the shell) must be maintained to achieve the concentricity necessary for high speed spinning. Precision balance is required throughout the rotor.

Optimum performance requires the use of the highest strength ceramic for the rotor shell 101 to maximize sample volume 105 and spinning speed. At a temperature below 600° C., the choice is transformation-toughened, partially stabilized zirconia (PZT). For dielectric loss considerations at high temperatures, it is necessary to avoid yttria as the major stabilizing agent. Magnesia at about 3% is preferred. The high level of commercial interest in $^{29}$Al NMR requires that the alumina content be kept below 200 ppm. Crystalline phase changes (monoclinic and metastable cubic to tetragonal) in PZT above 600°–700° C. result in drastically reduced strength.

Hot pressed silicon nitride is preferred for the rotor shell material above 650° C. Silicon carbide is not acceptable as it is a semiconductor.

To achieve low cost of disposables, it is necessary that the sample capsule 104 be of a soft ceramic so that it can produced at low cost. Machinable glasses (alumino-borosilicate glasses with dispersed crystalline crack propagation arresters) are available and represent satisfactory choices for applications where interfering NMR background signals do not present problems. Fused silica (quartz) may also be used except for $^{29}$Si NMR experiments. The soft ceramic cylindrical NMR holder is closed at one end by a flat bottom with a threaded throat opening at the opposite end. The sample holder's length is typically less than 4 times its diameter. Satisfactory high speed spinning requires that the cylindricity of both the shell and the capsule be better than 5 μm, preferably 1 μm.

An attractive general purpose option for the capsule material is boron nitride, hot pressed hexagonal BN, preferably without calcia binders, for improved thermal shock properties. Its extreme softness results in considerable wear of the bottom end 115 when instability results in failure of the axial thrust bearing 116. It is not practical to design for the low cost capsule to terminate precisely at the end of the rotor shell. Rather, it is preferable to have the capsule bottom extend initially about 0.05–0.15 mm beyond the rotor shell as a sacrificial bearing surface. When touchdowns occur, the sacrificial BN bearing surface 115 will quickly wear until it is flush with the end of the hard rotor shell 101, at which point wear will cease. In this manner, the capsule material completely fills the internal cavity of the rotor shell.

A substantial improvement in the air journal bearing stiffness is obtained by providing a central bearing exhaust tube 135 in the form of a zirconia ceramic tube cemented into the stator 114 between two adjacent turns of the copper coil 120 in a precision fit bearing exhaust hole 136. Without central bearing exhaust, effective hydrostatic bearing surface area exists only from the bearing orifices axially outward to the rotor ends. The addition of an enlarged central radial clearance region 137 with bearing exhaust hole 136 doubles the effective hydrostatic bearing surface area by allowing axially inward flow from the bearing orifices. The result is greatly enhanced bearing performance for the additional complexity of sealing a ceramic tube 135 into the stator 114 and housing 119. Rotational frequencies above 2000 Hz, as required for MAS NMR, may be achieved with rotor shell diameters up to 30 mm.

Radial-axial mixed inflow turbines are well known in the power range of 0.5–500 kW with Reynolds numbers of 20,000–1,000,000, but they have usually been considered impractical at lower powers. Exceptions may be found in cryogenics, where the high gas densities and low viscosities permit Reynolds numbers above 20,000 with sub-millimeter blade dimensions.

Figure 1:
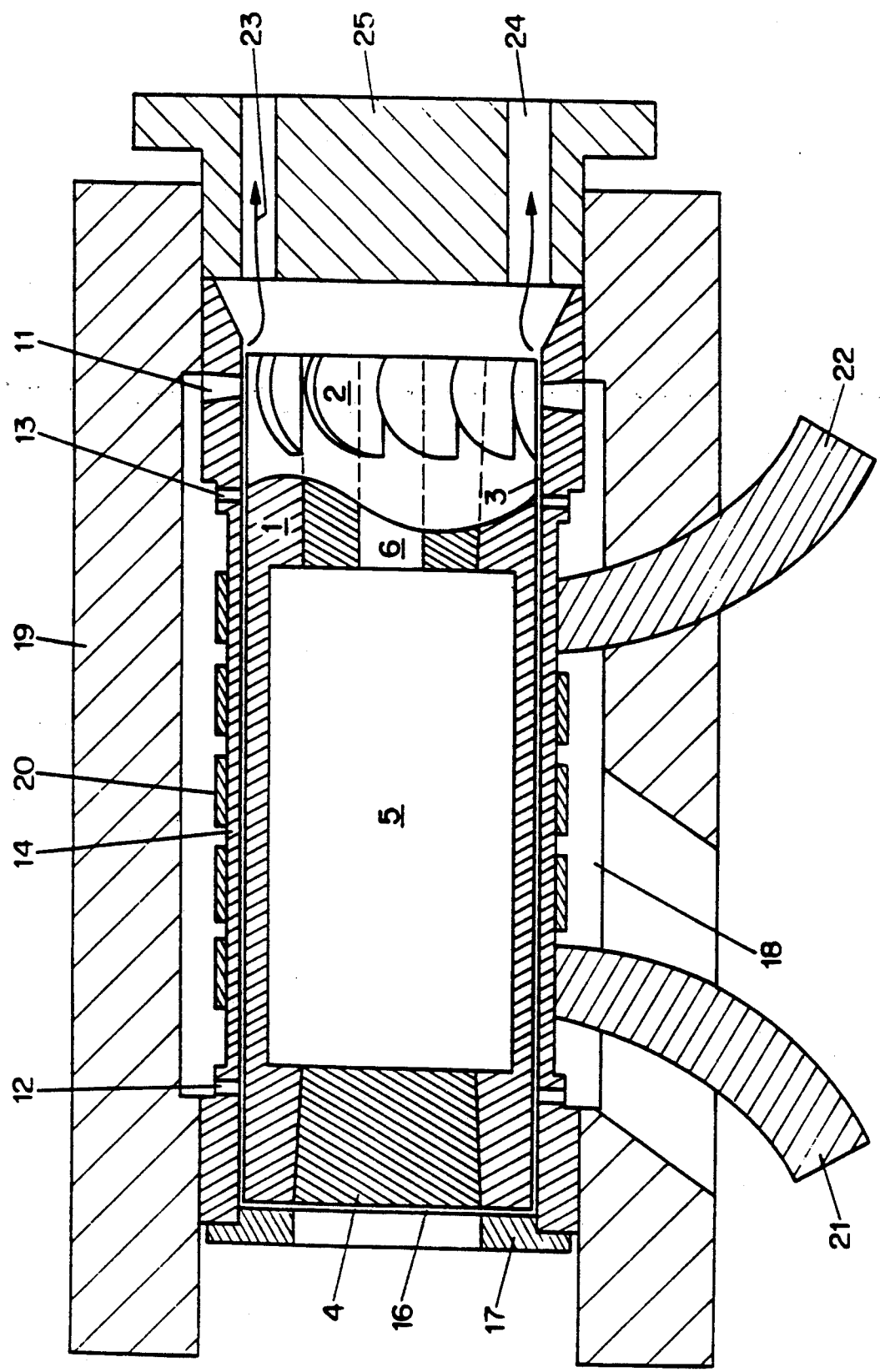
FIG. 1 illustrates the prior art high-temperature MAS all-zirconia spinner assembly.

The ceramic radial inflow microturbine 102 provides much higher isentropic efficiency compared to the prior art impulse (or Pelton) turbines 2 of FIG. 1. Moreover, the purely radial inflow permits reduced grinding costs compared to mixed radial-axial inflow turbines, with no loss in efficiency for this size range, i.e., 1-200 W, Reynolds numbers of 3,000-20,000, owing to the short blade length.

Figure 4:
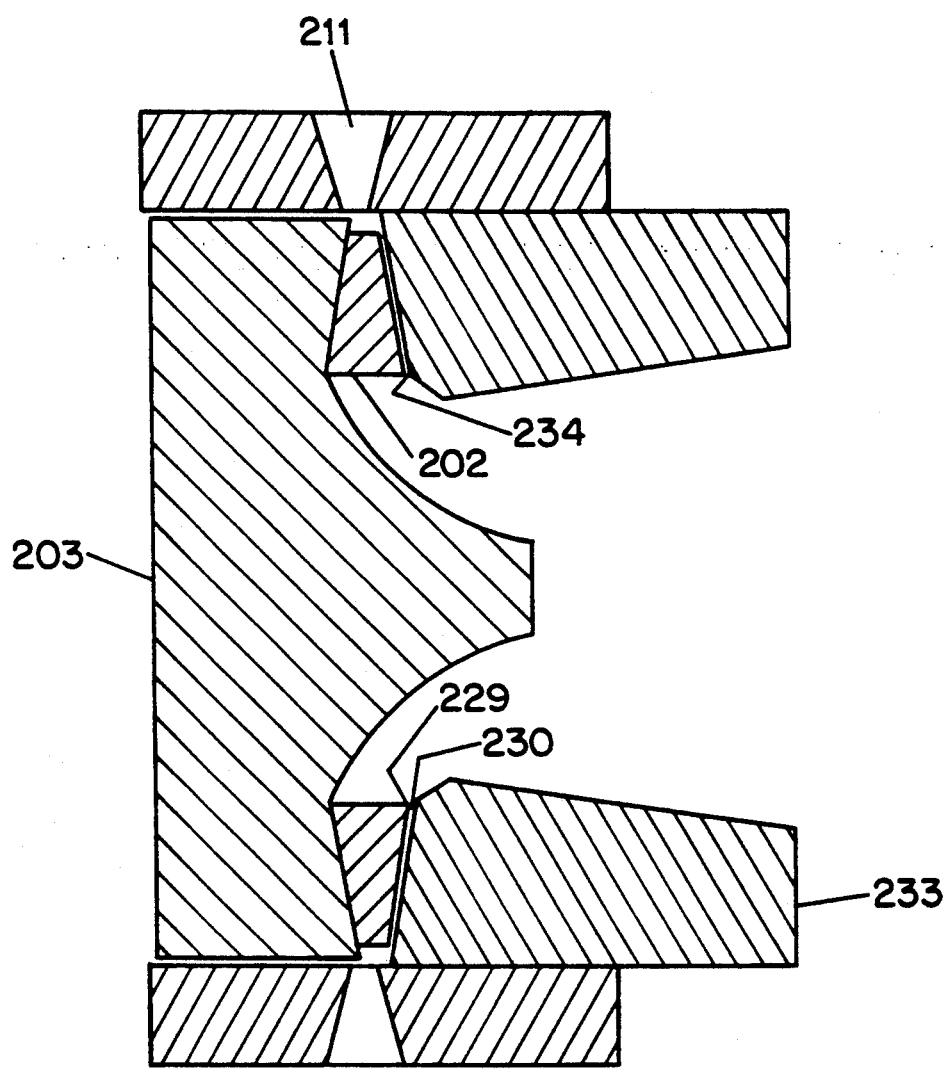
FIG. 4 shows a side view of a radial inflow microturbine with non-constant blade length.
Figure 5:
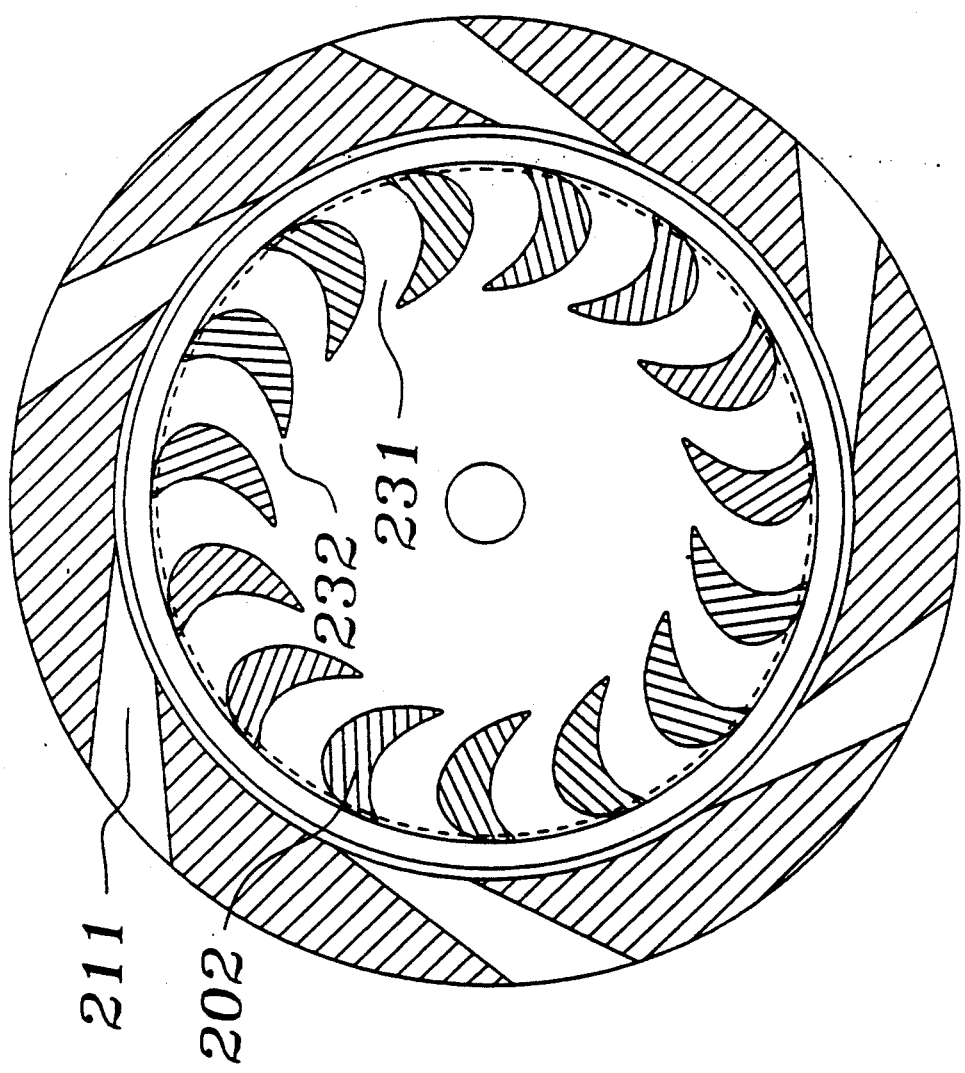
FIG. 5 is a cross-section of the microturbine of FIG. 4.

High efficiency single-stage turbines must operate with tip speeds at nominally half the speed of sound or higher. Low power levels require minuscule nozzle area. The radial inflow geometry, as illustrated in FIGS. 4 and 5, allows extremely small flow areas at high tip speeds without excessive rotational frequencies when the axial blade length is made extremely short at the perimeter. Gas entry and exit angles, $\alpha$ and $\beta$ are illustrated in FIG. 3. In the purely radial inflow turbine, the airfoil blades 202 protrude axially from a rotating support plate 203. Nozzles 211 admit high velocity gas inward from the perimeter at an entrance angle $\alpha$ of 50-75 degrees. The gas flows radially inward over the airfoil blades 202 and exits the blades radially inward off the trailing edge of the blades at an exit angle $\beta$ of typically 30-70 degrees. The gas flow is turned to exhaust axially after it passes the inner diameter of the blades. The blade length need not be constant in the radial direction to classify as a purely radial inflow turbine. In fact, it will often be desirable for the blade length to be greater near the exit edge than at the entrance edge as shown in FIG. 4. The gases are not allowed to exhaust over the blades with a substantial axial component. The radial blade dimension is usually less than half of the drive plate radius to allow higher exhaust gas velocity without swirl and so that the flow can be turned axially after exiting the blades.

The radial inflow blade geometry of the instant invention permits high efficiency with greatly simplified manufacturing of hard ceramics and composites owing to the absence of compound angles and their resulting concave contours of small radii at the base of the blades. The blade end geometry 229 also simplifies the requirement of making the axial-end leakage past the blades very small by simplifying the shroud geometry 233. The critical shroud clearance surface 234 is often simply flat or slightly conical but it may also be slightly convex, depending on the blade end geometry. Blade axial end clearance 130, 230 ideally should be several percent of the axial blade length. It will typically be under 10% of the axial blade length in microturbines. Clearances twice that large will also perform satisfactorily for low reaction designs. Axial blade length at the perimeter is typically 0.25-1 mm. A relatively small number of blades, typically 6-18, is preferred for high temperature ceramic microturbines (3.5 mm to 14 mm outside diameter) to permit the use of larger diamond tooling and to increase the Reynolds number. Continuously inwardly decreasing cross sectional flow area passages 131, 231 and sharp trailing edges 132, 232 on the blades are required for minimum flow separation and high efficiency.

The instant microturbine design may also be utilized effectively in cryogenic applications requiring high efficiency at very low powers. Although attempts have been made to develop micro-expanders, prior art designs have not been successful at power levels below may tens of watts. Plastic (especially composites and polyetherketone, PEK) or ceramic radial inflow microturbines according to the instant invention, with outside diameter of 3 mm and 12 blades of 0.15 mm axial length, will perform very well for 0.5 W helium Brayton expanders at 6K. Acceptable performance has even been demonstrated below 0.1 W at 6K.

Although this invention has been described herein with reference to specific embodiments, it will be recognized that changes and modifications may be made without departing from the spirit of the present invention.

We claim:

1. A cylindrical, ceramic NMR sample holder for spinning samples in an NMR experiment, said holder comprising:
   an outer hard ceramic thin-walled cylindrical rotor shell, substantially closed by a drive plate at one end;
   a soft ceramic disposable sample container capsule, said capsule completely filling the internal cavity in said hard shell;
   symmetric fluid impeller means externally on said drive plate to effect high speed spinning of said sample holder.

2. The NMR sample holder of claim 1 in which said soft ceramic capsule is chosen from the set consisting of machinable glasses, fused silica, and hot pressed hexagonal boron nitride.

3. The NMR sample holder of claim 1 in which said rotor shell is chosen from the set consisting of partially stabilized zirconia and hot pressed silicon nitride.

4. The NMR sample holder of claim 1 supported radially on gas journal bearings at each end and positioned axially by means of a gas thrust bearing at the end opposite said drive ring.

5. The NMR sample holder of claim 4 wherein means are provided so that bearing gas may exhaust axially in both opposite axial directions from each said journal bearing.

6. The NMR sample holder of claim 4 in which said soft ceramic capsule initially extends axially beyond said hard shell into said thrust bearing so as to form a sacrificial bearing surface.

7. The ceramic NMR holder of claim 1 wherein said disposable sample container capsule is secured inside said shell by an axial ceramic screw through said drive ring.

8. A soft ceramic disposable sample container for NMR samples shaped to fit inside a hard ceramic rotor, chosen from the set consisting of machinable glasses, fused silica, and boron nitride.

9. The soft ceramic disposable sample container of claim 8 wherein said sample container comprises boron nitride.

10. The soft ceramic cylindrical NMR sample holder of claim 8, closed at one end by a flat bottom, with a threaded throat opening at the opposite end, with length less than 4 times the diameter, wherein the cylindricity tolerance of said cylinder is less than 5 $\mu$m.

* * * * *